US012618144B2

(12) United States Patent
Leal Cervantes et al.

(10) Patent No.: US 12,618,144 B2
(45) Date of Patent: May 5, 2026

(54) SURFACE TREATMENT FOR SELECTIVE DEPOSITION

(71) Applicant: Applied Materials, Inc., Santa Clara, CA (US)

(72) Inventors: Carmen Leal Cervantes, Mountain View, CA (US); Yong Jin Kim, Albany, CA (US); Kevin Kashefi, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 304 days.

(21) Appl. No.: 17/682,431

(22) Filed: Feb. 28, 2022

(65) Prior Publication Data

US 2022/0275501 A1 Sep. 1, 2022

Related U.S. Application Data

(60) Provisional application No. 63/154,807, filed on Feb. 28, 2021.

(51) Int. Cl.
*C23C 16/04* (2006.01)
*C23C 16/02* (2006.01)
*C23C 16/455* (2006.01)
*H01J 37/32* (2006.01)

(52) U.S. Cl.
CPC .............. *C23C 16/02* (2013.01); *C23C 16/04* (2013.01); *C23C 16/45553* (2013.01);
(Continued)

(58) Field of Classification Search
CPC ... C23C 16/02; C23C 16/04; C23C 16/45553; C23C 16/34; C23C 16/45525;
(Continued)

(56) References Cited

U.S. PATENT DOCUMENTS 6,391,785 B1 * 5/2002 Satta ....................... C23C 16/32
257/E21.171
7,148,144 B1 * 12/2006 Avanzino ................. C01G 3/12
438/618

(Continued)

FOREIGN PATENT DOCUMENTS

CN 111512430 A 8/2020
JP 2018152554 A 9/2018
(Continued)

OTHER PUBLICATIONS

PCT International Search Report and Written Opinion in PCT/US2022/018146 dated Jun. 14, 2022, 9 pages.

*Primary Examiner* — Gordon Baldwin
*Assistant Examiner* — Christina D Mcclure
(74) *Attorney, Agent, or Firm* — SERVILLA WHITNEY LLC

(57) ABSTRACT

Methods of surface pretreatment during selective deposition are disclosed. One or more embodiment of the disclosure provides surface pretreatments which facilitate the removal of blocking layers. Some embodiments of the disclosure include a surface pretreatment comprising exposure of a substrate with a first surface and a second surface to modify the first surface, a blocking layer is deposited on the modified first surface, a film is selectively deposited on the second surface over the blocking layer, and the blocking layer is removed.

11 Claims, 5 Drawing Sheets

(52) U.S. Cl.
CPC . *H01J 37/32009* (2013.01); *H01J 2237/3321* (2013.01); *H01J 2237/335* (2013.01)

(58) Field of Classification Search
CPC .............. C23C 16/045; H01J 37/32009; H01J 2237/3321; H01J 2237/335; H10W 20/034; H10W 20/056; H10W 20/057; H10W 20/084; H10W 20/096; H10W 20/438; H10P 14/40; H10P 72/0454
See application file for complete search history.

(56) References Cited

U.S. PATENT DOCUMENTS

| | | | |
|---|---|---|---|
| 2003/0224595 A1* | 12/2003 | Smith | H01L 21/76814 257/E21.252 |
| 2010/0167542 A1 | 7/2010 | Drewes et al. | |
| 2016/0247695 A1* | 8/2016 | Niskanen | H01L 21/32135 |
| 2018/0082942 A1* | 3/2018 | Chawla | H01L 23/5226 |
| 2018/0122687 A1* | 5/2018 | Cooper | H01L 23/53238 |
| 2019/0067197 A1* | 2/2019 | Yu | H01L 21/288 |
| 2019/0267282 A1* | 8/2019 | Gstrein | H01L 21/3086 |
| 2019/0390340 A1* | 12/2019 | Yu | C23C 16/45544 |
| 2020/0234950 A1 | 7/2020 | Saly et al. | |
| 2020/0328078 A1* | 10/2020 | Tapily | H01L 21/02189 |
| 2020/0350204 A1 | 11/2020 | Yu et al. | |
| 2020/0411374 A1* | 12/2020 | Huang | H01L 21/76886 |

FOREIGN PATENT DOCUMENTS

| | | | |
|---|---|---|---|
| TW | 201830691 A | 8/2018 | |
| WO | WO-2019018379 A1 * | 1/2019 | C23C 16/0245 |
| WO | WO-2019023001 A1 * | 1/2019 | H01L 21/02112 |

* cited by examiner

SURFACE TREATMENT FOR SELECTIVE DEPOSITION

CROSS-REFERENCE TO RELATED APPLICATIONS

This application claims priority to U.S. Provisional Application No. 63/154,807, filed Feb. 28, 2021, the entire disclosure of which is hereby incorporated by reference herein.

TECHNICAL FIELD

Embodiments of the disclosure generally relate to surface treatments for selective deposition methods on non-metallic surfaces. More particularly, some embodiments of the disclosure are directed to methods of selective deposition on non-metallic surfaces using a surface treatment and blocking compounds comprising a SAM and/or an unsaturated hydrocarbon. The surface treatment facilitates removal of the blocking compound before later deposition.

BACKGROUND

Selective deposition processes are gaining a lot of momentum mostly because of the need for patterning applications for semiconductors. Traditionally, patterning in the microelectronics industry has been accomplished using various lithography and etch processes. However, since lithography is becoming exponentially complex and expensive the use of selective deposition to deposit features is becoming much more attractive. Another potential application for selective deposition is gap fill. In gap fill, the fill film is grown selectively from the bottom of a trench towards the top. Selective deposition could be used for other applications such as selective sidewall deposition where films are grown on the side of the fin. This would enable the deposition of a sidewall spacer without the need for complex patterning steps.

In middle of the line (MOL) and back end of the line (BEOL) structures, barrier films are typically used between metal lines and dielectric layers to prevent diffusion and other adverse interactions between the dielectric layers and the metal lines. Yet barrier films are typically the largest contribution to via resistance due to their high resistivity.

Past approaches have focused on reducing the thickness of barrier films or finding barrier films with lower resistivity to decrease via resistance. However, increased via resistance as a result of barrier films remains an issue, especially in smaller CD features when barrier films on sidewalls form an increasing percentage of the via volume.

Another approach has been to block or decrease the thickness of the barrier film on the metal surface at the bottom of the via while the thickness on the dielectric surface at the sidewalls remains. Since the barrier properties of the barrier film directly relate to the thickness of the film between the metal and the dielectric, this approach allows for the barrier film to remain intact, but the reduced thickness on the metal surface improves via resistance. These processes are referred to as selective deposition processes.

The current solution is to use of a self-assembled monolayer (SAM) to inhibit the nucleation and growth of the barrier film on the metal surface. To prevent deposition, a strong interaction between the SAM and the metal surface is preferred, but this interaction can be an obstacle to removal of the SAM for later deposition processes.

Accordingly, there is a need for surface pretreatment methods which facilitate the removal of SAMs.

SUMMARY

One or more embodiments of the disclosure are directed to a selective deposition method comprising exposing a substrate comprising a first material with a first surface and a second material with a second surface to a surface pretreatment to modify the first surface and form a modified first surface. The substrate is exposed to a blocking compound to selectively form a blocking layer on the modified first surface. A first film is selectively deposited on the second surface over the blocking layer. The blocking layer is removed from the first material. The surface pretreatment facilitates the removal of the blocking layer from the first surface.

BRIEF DESCRIPTION OF THE DRAWINGS

So that some of the features of the present disclosure can be understood in detail, a more particular description of the disclosure, briefly summarized above, may be had by reference to embodiments, some of which are illustrated in the appended drawings. It is to be noted, however, that the appended drawings illustrate only some exemplary embodiments of this disclosure and are therefore not to be considered limiting of its scope, for the disclosure may admit to other equally effective embodiments.

DETAILED DESCRIPTION

Figure 1:
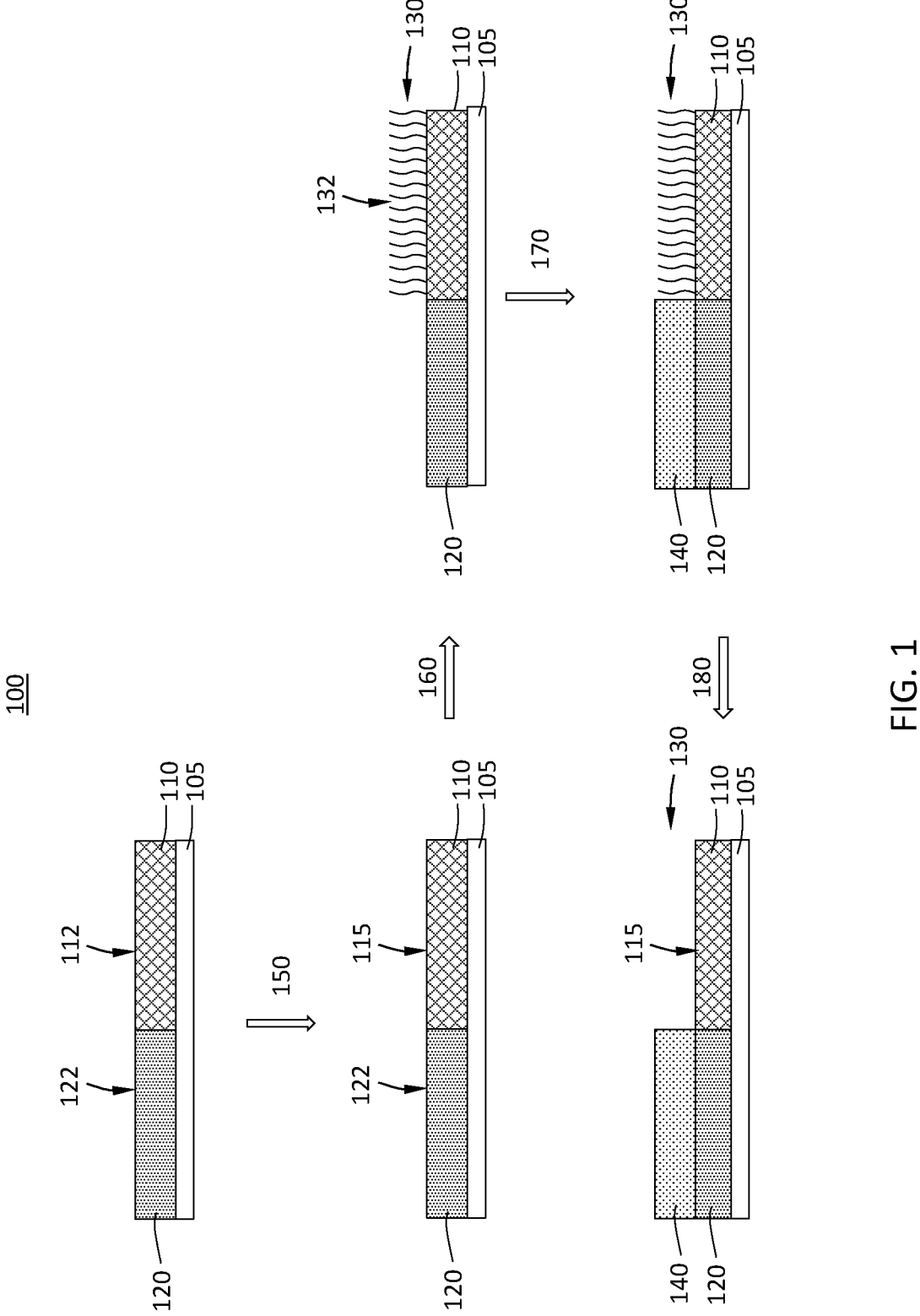
FIG. 1 illustrates a cross-sectional view of an exemplary substrate during processing according to one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

In recent decades, the semiconductor community has made attempts to improve integrated circuit (IC) processing by replacing lithography steps with alternatives that translate to lower cost, reduced processing time, and smaller feature sizes. Many of these alternatives fall under the blanket category of "selective deposition." In general, selective deposition refers to a process for which the net deposition rate is higher on the target substrate material relative to other substrate materials, such that the desired film thickness is achieved on the target substrate material with negligible deposition on the other substrate materials (where "negligible" is defined by process constraints).

Selective deposition of materials can be accomplished in a variety of ways. A chemical precursor may react selectively with one surface relative to another surface (metallic or dielectric). Process parameters such as pressure, substrate temperature, precursor partial pressures, and/or gas flows might be modulated to modulate the chemical kinetics of a particular surface reaction. Another possible scheme involves surface pretreatments that can be used to activate or deactivate a surface of interest to an incoming film deposition precursor. Typically, selective deposition refers to the deposition of a film on a metal surface. A reverse selective deposition process deposits a film on the dielectric surface rather than the metal surface.

One strategy to achieve selective deposition employs the use of blocking layers. Ideally, this strategy involves (1) formation of a blocking layer on substrate materials on which deposition is to be avoided with negligible impact to the target substrate material, (2) deposition on the target substrate material (where deposition on other substrate materials is "blocked" by the blocking layer), and (3) removal of the blocking layer without net adverse effects to the deposited film.

One or more embodiments of the disclosure are directed to methods of surface treatment which facilitate the removal of a blocking layer. In some embodiments, the blocking layer is used in a selective deposition scheme. In some embodiments, the selective deposition scheme deposits a barrier layer within a substrate feature.

As used in this specification and the appended claims, the phrases "metallic material surface" or "non-metallic material surface" refers to the surface of a metallic or non-metallic material, respectively. A non-metallic material, for the purposes of this disclosure, is any material that exhibits the properties of a poor conductor, or a good insulator.

Conversely, a metallic material is any material that exhibits the properties of a good conductor, or a poor insulator. A non-metallic material may include metal atoms (e.g., tantalum nitride, titanium nitride) and still fall into the scope of non-metallic materials. In some embodiments, the terms "conductive material" and "insulating material" are used in place of metallic material and non-metallic material, respectively.

As used in this specification and the appended claims, the term "selectively depositing on a first surface over a second surface", and the like, means that a first amount or thickness is deposited on the first surface and a second amount or thickness is deposited on the second surface, where the second amount or thickness is less than the first amount or thickness, or, in some embodiments, no amount is deposited on the second surface.

As used in this regard, the term "over" does not imply a physical orientation of one surface on top of another surface, rather a relationship of the thermodynamic or kinetic properties of the chemical reaction with one surface relative to the other surface. For example, selectively depositing a cobalt film onto a copper surface over a dielectric surface means that the cobalt film deposits on the copper surface and less or no cobalt film deposits on the dielectric surface; or that the formation of the cobalt film on the copper surface is thermodynamically or kinetically favorable relative to the formation of a cobalt film on the dielectric surface.

In some embodiments, "selectively" means that the subject material forms on the selected surface at a rate greater than or equal to about 2×, 3×, 4×, 5×, 7×, 10×, 15×, 20×, 25×, 30×, 35×, 40×, 45× or 50× the rate of formation on the non-selected surface. Stated differently, the selectivity of the stated process for the selected surface relative to the non-selected surface is greater than or equal to about 2:1, 3:1, 4:1, 5:1, 7:1, 10:1, 15:1, 20:1, 25:1, 30:1, 35:1, 40:1, 45:1 or 50:1.

One or more embodiments of this disclosure are directed to methods of selectively forming a blocking layer on a first material surface of a substrate over a second material surface. In some embodiments, the substrate comprises a metallic material (conductive material) and a non-metallic material (insulating material). In some embodiments, the surface of the metallic material is referred to as the first material surface and the surface of the non-metallic material is referred to as the second material surface. In some embodiments, the labels of first material surface and second material surface are switched.

The metallic material of the substrate may be any suitable metallic material. In some embodiments, the metallic materials of this disclosure are conductive materials. Suitable metallic materials include, but are not limited to, metals, conductive metal nitrides, conductive metal oxides, metal alloys, silicon, combinations thereof and other conductive materials.

In some embodiments, the metallic material comprises or consists essentially of one or more of chromium, manganese, iron, copper, nickel, cobalt, tungsten, ruthenium, molybdenum, tantalum or titanium. In some embodiments, the metallic material comprises or consists essentially of copper, cobalt, ruthenium, tungsten or molybdenum. In some embodiments, the metallic material comprises or consists essentially of silicon. As used in this specification and the appended claims, the term "consists essentially of" means that the material is greater than or equal to about 95%, 98% or 99% of the stated material on an atomic basis.

As used in this specification and the appended claims, the term "oxide" or the like means that the material contains the specified metallic element(s) and oxygen. The term should not be interpreted to imply a specific ratio of elements, stoichiometric or non-stoichiometric.

The non-metallic material of the substrate may be any suitable material. In some embodiments, the non-metallic materials of this disclosure are dielectric materials. Suitable non-metallic materials include, but are not limited to, silicon oxides (e.g. $SiO_2$), silicon nitrides, silicon carbides and combinations thereof (e.g. SiCON). Suitable non-metallic materials further include aluminum oxide, aluminum nitride and low-k dielectric materials. In some embodiments, the non-metallic material comprises or consists essentially of silicon dioxide ($SiO_2$). In some embodiments, the non-metallic material comprises or consists essentially of silicon nitride.

Referring to FIG. 1, an exemplary method 100 begins with a substrate 105 comprising a first material 110 having a first surface 112 and a second material 120 having a second surface 122. Further, the substrate 105 has a substrate surface comprising the first surface 112 and the second surface 122. As mentioned above, in some embodiments, the first material 110 comprises a conductive material and the second material 120 comprises an insulating material.

At operation 150, the substrate surface is exposed to a surface pretreatment to modify at least the first surface 112 and form a modified first surface 115. As used in this manner, the phrase "the substrate surface is exposed to" means that the substrate as a whole, including the individual materials and layers thereon, specifically their exposed surfaces, are exposed to the stated process or condition. Without being bound by theory, the surface pretreatment facilitates the later removal of the blocking layer deposited at operation 160.

The surface pretreatment can be any surface modification which facilitates the removal of the blocking layer without substantially adversely affecting the ability of the blocking layer to prevent or minimize deposition on the first material. In some embodiments, the surface pretreatment comprises exposing the first surface to a nitrogen-containing reactant. In some embodiments, the nitrogen-containing reactant is exposed to the first surface as a plasma. In some embodiments, the nitrogen-containing reactant is exposed to the first surface without plasma (e.g., thermal exposure). In some embodiments, the nitrogen-containing reactant comprises or consists essentially of one or more of nitrogen gas ($N_2$), ammonia ($NH_3$), nitrous oxide ($N_2O$), nitrogen dioxide ($NO_2$), hydrazine ($N_2H_4$), or derivatives thereof.

Without being bound by theory, it is believed that exposure to the nitrogen-containing reactant modifies the first surface by chemisorbing nitrogen atoms to at least a portion of the first surface. The nitrogen atoms at the surface do not adversely affect the ability of the blocking compound to bond to the first surface and inhibit deposition thereon, but they do facilitate the removal of the blocking layer by interposing nitrogen atoms between at least some molecules of the blocking compound and the first surface, thereby lessening the average bond energy between the blocking compound and the first surface.

At operation 160, the substrate 105 is exposed to a blocking compound to selectively form a blocking layer 130 on the modified first surface 115 over the second surface 122. In some embodiments, the surface of the blocking layer is described as a blocked first surface 132. Alternatively, the blocking layer may be referred to as a passivation layer and the blocked first surface referred to as a passivated first surface.

The blocking layer 130 is illustrated in the Figures as a series of parallel wavy lines; however, the skilled artisan will recognize that this merely used as a generic representation and does not imply any particular morphology, density or structure of the blocking layer 130.

The blocking compound may be any compound capable of selectively forming a blocking layer 130 on the modified first surface 115 over the second surface 122. In some embodiments, the blocking compound comprises a blocking molecule with the general formula A-L, where A is a reactive head group and L is a carbonaceous tail group. In some embodiments, the blocking molecule comprises or consists essentially of n-octadecyltris(dimethylamino)silane.

As used in this manner, the "head group" is a chemical moiety that associates with the modified first surface 115 and the "tail group" is a chemical moiety that extends away from the modified first surface 115.

In some embodiments, the first material 110 comprises an insulating material and A is selected from the group consisting of $(R_2N)_3Si—$, $X_3Si—$ and $(RO)_3Si—$, where each R is independently selected from C1-C6 alkyl, C4-C8 cycloalkyl and C4-C8 aryl, and each X is independently selected from halogens. In some embodiments, the first material 110 comprises a conductive material and A is selected from the group consisting of $(HO)_2OP—$, $HS—$ and $H_3Si—$.

Some of the reactive head groups listed above comprise more than one reactive moiety in a single reactive head group (e.g. $H_3Si—$ may bond up to three times with the surface) which is attached to tail group, L. In some embodiments, A is selected from reactive groups where less than the number of reactive moieties listed above and is attached to more than one tail group, L. In these embodiments, the tail groups may be the same or different.

In some embodiments, L is $—(CH_2)_nCH_3$ and n is an integer from 3 to 25. In some embodiments, the tail group L comprises less than 18 carbon atoms. In some embodiments, the tail group comprises less than 17, 16, 15, 14, 13, 12, 11, 10, 9, 8, 7, 6, or 5 carbon atoms. In some embodiments, L comprises one or more reactive moiety to form a reactive tail group.

In some embodiments, the tail groups associate with each other through relatively slow van der Waals interaction. In some embodiments, the tail groups can be the same or different so that a homogeneous or heterogeneous SAM can be formed. In some embodiments, the blocking compound comprises at least two different blocking molecules so that a heterogeneous SAM is formed.

The blocking compound can be delivered to the substrate as a single compound or sequential exposures of multiple compounds to form the blocking layer 130. In some embodiments, the modified first surface 115 is exposed to a single compound that assembles on the surface in an ordered or semi-ordered manner.

In some embodiments, the conditions for delivery of the blocking compound to the substrate are controlled. In some embodiments, the conditions are controlled to maximize SAM homogeneity on the substrate surface. In some embodiments, the pressure during delivery of the blocking compound is in a range of 15 to 50 torr. In some embodiments, the temperature of the substrate is maintained in a range of 150° C. to 400° C.

In some embodiments, the blocking compound comprises an unsaturated hydrocarbon. Without being bound by theory, it is believed that the d-orbitals of the metallic materials start to share electrons with the $sp^2$ orbitals of the unsaturated hydrocarbon. Accordingly, in some embodiments, the unsaturated hydrocarbon comprises at least one compound with at least one double bond between two carbon atoms. In some embodiments, the unsaturated hydrocarbon comprises at least one compound with at least one triple bond between two carbon atoms. Stated differently, in some embodiments, the unsaturated hydrocarbon comprises at least one compound with a general formula of R'=R" or R'≡ER". In some embodiments, the compound of the unsaturated hydrocarbon contains only one unsaturated bond. Without being bound by theory, it is believed that multiple unsaturated bonds increases the likelihood of polymerization and increases the difficulty of removing the blocking layer without damaging the surrounding substrate materials.

Further, without being bound by theory, it is believed that the unsaturated hydrocarbon (the blocking layer 130) suppresses one or more of the nucleation or growth rate of a subsequent film on the modified first surface 115.

In some embodiments, R' and R" are identical. In some embodiments, R' and R" are independent C2-C6 groups. As used in this regard, a "C2-C6 group" contains 2-6 carbon atoms. In some embodiments, R' and R" comprise only carbon and hydrogen atoms. In some embodiments, R' and R" do not comprises any surface reactive moieties. In some embodiments, the compound of the unsaturated hydrocarbon does not contain an unsaturated bond with a terminal carbon. In some embodiments, the compound of the unsaturated hydrocarbon comprises 4-12 carbon atoms. In some embodiments, R' and/or R" are linear molecules (e.g., a straight-chain unsaturated hydrocarbon). In some embodiments, R' and/or R" are branched. In some embodiments, the compound of the unsaturated hydrocarbon comprises or consists essentially of 3-hexyne. As used in this manner, the term "consists essentially of" means that greater than or equal to about 95%, 98%, 99% or 99.5% of the unsaturated hydrocarbon, on a molar basis, is the stated compound. In some embodiments, the compound of the unsaturated hydrocarbon comprises or consists essentially of 5-decyne.

In some embodiments, the substrate is soaked in a vapor of the unsaturated hydrocarbon. In some embodiments, the processing conditions for exposing the substrate to the unsaturated hydrocarbon may be controlled.

In some embodiments, the pressure of the processing chamber is controlled. The pressure of the processing chamber may be any suitable pressure for forming the blocking layer. In some embodiments, the pressure of the processing chamber is maintained at less than or equal to about 80 Torr, less than or equal to about 70 Torr, less than or equal to about 60 Torr, less than or equal to about 50 Torr, less than or equal to about 40 Torr, less than or equal to about 30 Torr, less than or equal to about 20 Torr, less than or equal to about 15 Torr, less than or equal to about 10 Torr, or less than or equal to about 5 Torr. In some embodiments, the pressure of the processing chamber is maintained at about 10 Torr, about 20 Torr, about 25 Torr, about 30 Torr, about 40 Torr, or about 50 Torr.

In some embodiments, the flow rate of the unsaturated hydrocarbon into the processing chamber is controlled. The flow rate of the unsaturated hydrocarbon may be any suitable flow rate for forming the blocking layer. In some embodiments, the flow rate of the unsaturated hydrocarbon is in a range of about 50 sccm to about 1000 sccm, in a range of about 100 sccm to about 800 sccm, in a range of about 400 sccm to about 700 sccm, in a range of about 500 sccm to about 650 sccm, or in a range of about 550 sccm to about 650 sccm. In some embodiments, the flow rate of the unsaturated hydrocarbon is less than or equal to about 1000 sccm, less than or equal to about 800 sccm, less than or equal to about 700 sccm, less than or equal to about 650 sccm, less than or equal to about 600 sccm, less than or equal to about 550 sccm, less than or equal to about 500 sccm, less than or equal to about 400 sccm, less than or equal to about 300 sccm, or less than or equal to about 200 sccm. In some embodiments, the flow rate of the unsaturated hydrocarbon is greater than or equal to about 50 sccm, greater than or equal to about 100 sccm, greater than or equal to about 200 sccm, greater than or equal to about 300 sccm, less than or equal to about greater 400 sccm, greater than or equal to about 500 sccm, greater than or equal to about 550 sccm, greater than or equal to about 600 sccm, greater than or equal to about 650 sccm, greater than or equal to about 700 sccm, or greater than or equal to about 800 sccm. In some embodiments, the flow rate of the unsaturated hydrocarbon is about 50 sccm, about 100 sccm, about 200 sccm, about 300 sccm, about 400 sccm, about 500 sccm, about 550 sccm, about 600 sccm, about 650 sccm, about 700 sccm, about 800 sccm, or about 1000 sccm.

In some embodiments, the soak period, during which the unsaturated hydrocarbon is exposed to the substrate, is controlled. The soak period may be any suitable period for forming the blocking layer. In some embodiments, the soak period is greater than or equal to about 10 s, greater than or equal to about 20 s, greater than or equal to about 30 s, greater than or equal to about 45 s, greater than or equal to about 60 s, greater than or equal to about 90 s, greater than or equal to about 120 s, greater than or equal to about 150 s, greater than or equal to about 200 s, or greater than or equal to about 250 s. In some embodiments, the soak period is less than or equal to about 300 s, less than or equal to about 250 s, less than or equal to about 200 s, less than or equal to about 150 s, less than or equal to about 120 s, less than or equal to about 90 s, less than or equal to about 60 s, less than or equal to about 45 s, less than or equal to about 30 s, or less than or equal to about 20 s. In some embodiments, the soak period is about 60 s. In some embodiments, the soak period is about 200 s.

In some embodiments, the temperature of the substrate is controlled during exposure to the unsaturated hydrocarbon. In some embodiments, each of the operations disclosed herein is performed at about the same temperature. In this case, the temperature of the substrate may also be referred to as the operating temperature. In some embodiments, during exposure to the unsaturated hydrocarbon, the temperature of the substrate is less than or equal to about 300° C., less than or equal to about 275° C., less than or equal to about 250° C., less than or equal to about 225° C., less than or equal to about 200° C., or less than or equal to about 150° C. In some embodiments, during exposure to the unsaturated hydrocarbon, the temperature of the substrate is greater than or equal to about 100° C., greater than or equal to about 150° C., greater than or equal to about 200° C., greater than or equal to about 225° C., greater than or equal to about 250° C., or greater than or equal to about 275° C.

In some embodiments, the compound of the unsaturated hydrocarbon is a liquid at the operating temperature. In some embodiments, the compound of the hydrocarbon has a vapor pressure greater than or equal to about 0.1 Torr at the operating temperature.

In some embodiments, the method 100 continues at operation 170 with the deposition of a first film 140 on the second surface 122 over the blocked first surface 132. The first film 140 may be deposited by any technique known to the skilled artisan. The deposition of the first film 140 on the second surface 122. In some embodiments, the first material 110 comprises a conductive material and the second material 120 comprises an insulating material, so the method can be referred to as "reverse selective deposition." The skilled artisan will understand that the term "selective deposition" is typically applied to the formation of a film on a conductive material over an insulating material. A reverse selective deposition process forms the film on the insulating material.

In some embodiments, the first film 140 is deposited by atomic layer deposition. In some embodiments, the first film 140 is deposited by sequentially exposing the substrate 105 to a metal precursor and a reactant. In some embodiments, the film 140 comprises a metal nitride.

In some embodiments, the first film 140 functions as a barrier film. In some embodiments, the first film 140 comprises or consists essentially of titanium nitride. In some embodiments, the first film 140 comprises or consists essentially of tantalum nitride. In some embodiments, the metal precursor comprises pentakis(dimethylamino)tantalum. In some embodiments, the reactant comprises ammonia. In some embodiments, the first film 140 is formed without the use of plasma.

In some embodiments, the method 100 optionally includes a post-treatment process before removal of the blocking layer. Without being bound by theory, it is believed that the post-treatment may also help facilitate the removal of the blocking layer. In some embodiments, the post treatment comprises exposing the substrate to a reactant comprising or consisting essentially of one or more of hydrogen ($H_2$), ammonia, water, or oxygen ($O_2$). In some embodiments, the reactant comprises substantially no hydrogen ($H_2$). In some embodiments, the reactant comprises substantially no oxygen ($O_2$). In some embodiments, the post treatment reactant is provided without plasma (e.g., thermal).

the method 100 continues at operation 180 by removing the blocking layer 130 from the modified first surface 115. The blocking layer 130 may be removed by any suitable means, including but not limited to, plasma cleaning processes. In some embodiments, the substrate 105 is exposed to a plasma to remove the blocking layer 130 from the modified first surface 115. In some embodiments, the plasma comprises or consists essentially of one or more of argon (Ar), nitrogen ($N_2$), hydrogen ($H_2$), or ammonia. As used in this specification, a plasma comprising nitrogen, hydrogen, oxygen, or the like, means a plasma formed from the molecular form of the species named. For example, a nitrogen plasma refers to a plasma ignited from molecular nitrogen ($N_2$). As used in this specification and the appended claims, an element-containing plasma (e.g., a nitrogen-containing plasma) refers to a compound that includes the element. For example, a nitrogen-containing plasma comprises or consists essentially of one or more compounds having nitrogen as an element (e.g., ammonia ($NH_3$)). In some embodiments, the plasma consists essentially of argon. In some embodiments, the plasma comprises or consists essentially of a mixture of $H_2$ and Ar.

In some embodiments, the mixture of $H_2$ and Ar has a ratio of $H_2$:Ar in a range of about 10:1 to about 1:10, in a range of about 10:1 to about 1:1, in a range of about 1:1 to about 1:10, in a range of about 5:1 to about 1:5, in a range of about 5:1 to about 1:1, in a range of about 1:1 to about 1:5, in a range of about 2:1 to about 1:2, in a range of about 2:1 to about 1:1, or in a range of about 1:1 to about 1:2. In some embodiments, the mixture of $H_2$/Ar is about 1:1.

The power of the plasma may be varied depending on the composition, packing and/or thickness of the blocking layer and composition and/or thickness of the surrounding materials. In some embodiments, the plasma power is in a range of about 200 W to about 1000 W, in a range of about 300 W to about 800 W, in a range of about 400 W to about 600 W, in a range of about 200 W to about 800 W, in a range of about 200 W to about 600 W, in a range of about 400 W to about 1000 W, or in a range of about 400 W to about 800 W. In some embodiments, the plasma power is about 300 W, about 400 W, about 500 W, about 600 W, or about 700 W.

The duration of the plasma exposure may be varied depending on the composition, packing and/or thickness of the blocking layer 130 and composition and/or thickness of the surrounding materials. In some embodiments, the substrate is exposed to the plasma for a period in a range of about 2 s to about 600 s, in a range of about 5 s to about 300 s, or in a range of about 10 s to about 200 s. In some embodiments, the substrate is exposed to the plasma for a period of about 15 s, about 30 s, about 60 s, about 100 s, about 200s or about 300 s.

The method 100 may continue by depositing a second film on the substrate surface. While this operation is not shown in FIG. 1, the parameters of the operation are described in detail below with respect to operations 290 and 390.

Figure 2:
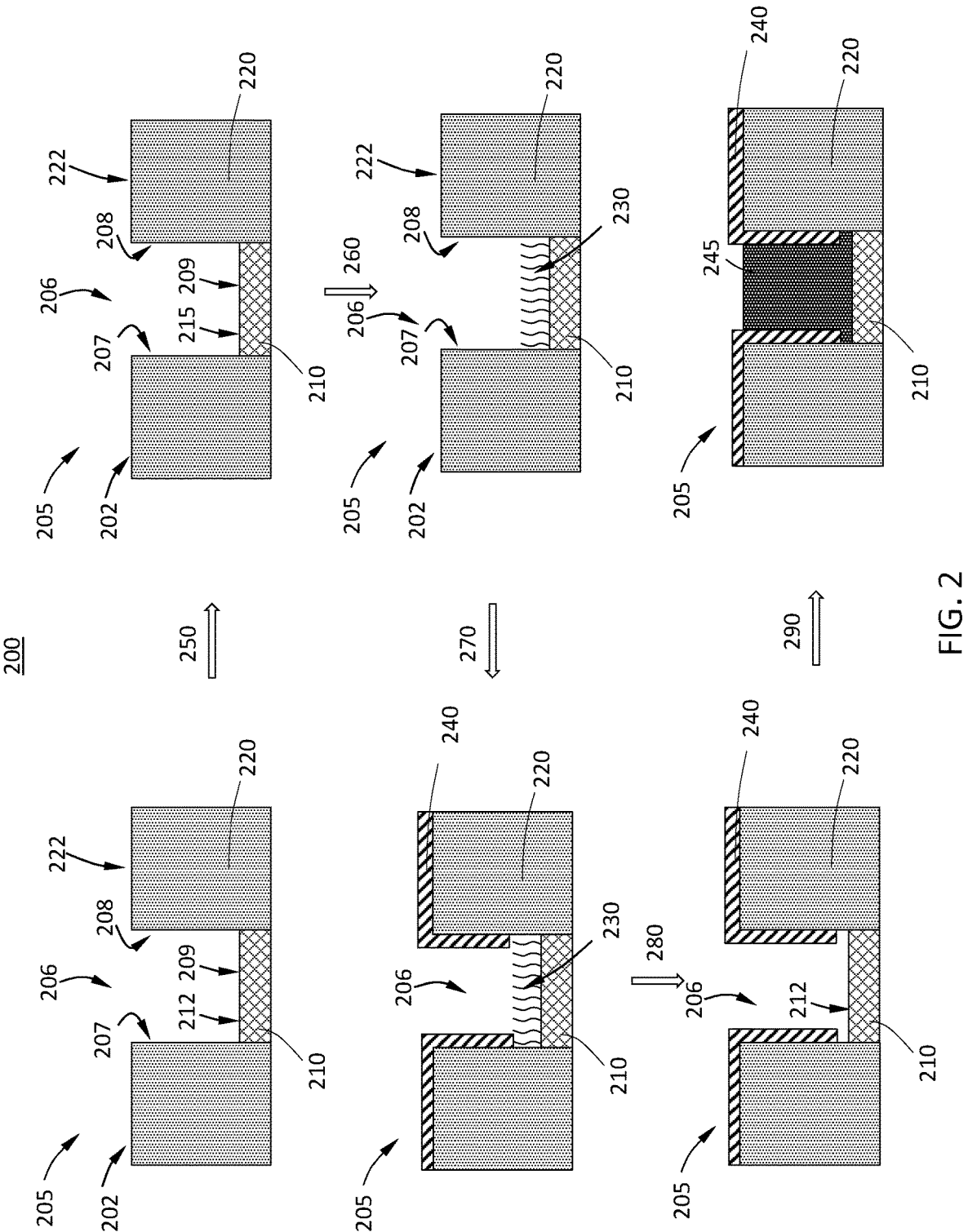
FIG. 2 illustrates a cross-sectional view of an exemplary substrate during processing according to one or more embodiment of the disclosure.

Referring to FIG. 2, an exemplary reverse selective deposition method 200 begins by providing a substrate 205 having a substrate top surface 202 with at least one feature 206 formed therein. The different films and layers described are analogous to those of FIG. 1 and the skilled artisan will recognize that these are merely different structural forms of similar methods.

The at least one feature extends a depth into the substrate from the substrate top surface 202 to a bottom 209 and has a width between a first sidewall 207 and a second sidewall 208. In the illustrated embodiment, the sidewalls 207, 208 comprise, and are formed by, a first material 210. The bottom 209 comprises and is formed by a second material 220. The at least one feature 206 may have one sidewall (e.g. a circular via), two sidewalls (e.g. a trench) or more sidewalls (e.g. square or polygonal via).

The method continues at operation 250 by exposing the substrate surface to a surface pretreatment to modify at least the first surface 212 and form a modified first surface 215. The parameters of the pretreatment are disclosed above with respect to operation 150.

The method 200 continues at operation 260 by exposing the substrate 205 to a blocking compound to selectively form a blocking layer 230 on the modified first surface 215 of the first material 210 forming the bottom 209 of the feature 206 over the second surface 222 of the second material 220 forming the substrate top surface 202 and feature sidewalls 207, 208. Stated differently, the substrate 205 is treated with a blocking compound to deactivate or block future deposition on the first material 210.

The method 200 continues at operation 270 by selective deposition of a first film 240 on the second surface 222 over the blocking layer 230. In some embodiments, operation 270 represents a reverse selective deposition process. Again, the skilled artisan will understand that the term "reverse selective deposition" refers to a selective deposition process in which a film is formed on the surface of an insulating material. In some embodiments, the first film 240 is deposited by sequentially exposing the substrate 205 to a metal precursor and a reactant. In some embodiments, the first film 240 comprises a material that acts as a barrier layer.

The method 200, at operation 280, continues by removing the blocking layer 230 from the first surface 212 of the first material 210 on the bottom 209 of the feature 206.

Without being bound by theory, it is believed that the continued presence of blocking layer 230 leads to issues with pull out of deposited materials due to poor adhesion between the first material 210 and a later deposited second film 245. Further, the continued presence of blocking layer 230 may contribute to the formation of bottom voids between the first material 210 and the second film 245.

After the blocking layer 230 is removed at operation 280, the method 200 continues at operation 290 by depositing a second film 245 within the at least one feature 206 to form a low-resistance metal via. In some embodiments, the second film is a conductive material facilitating electrical contact between the first material 210 through the feature 206.

Figure 3:
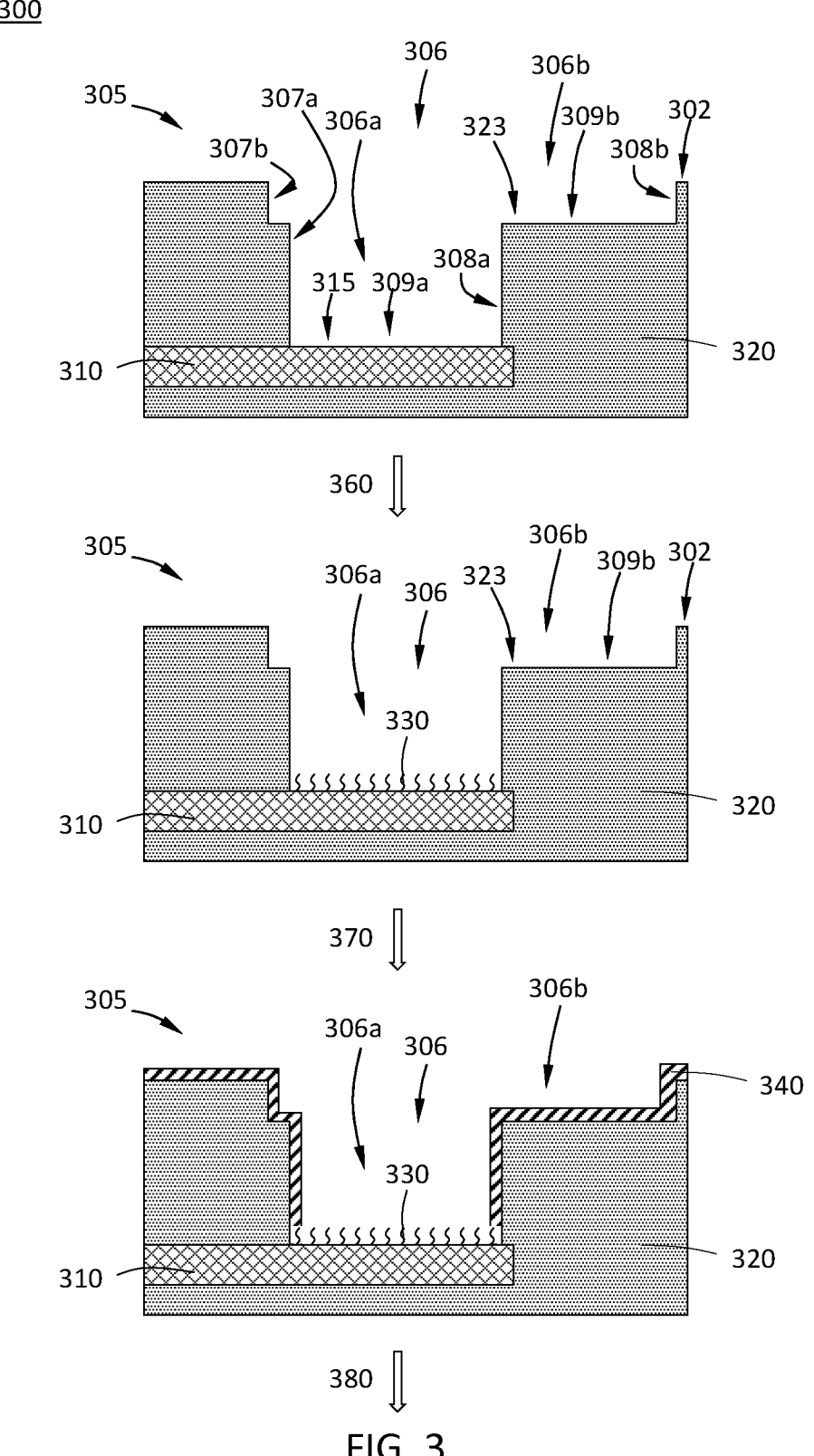
FIG. 3 illustrates a schematic cross-sectional view of an exemplary substrate during selective deposition according to one or more embodiment of the disclosure.
Figure 3:
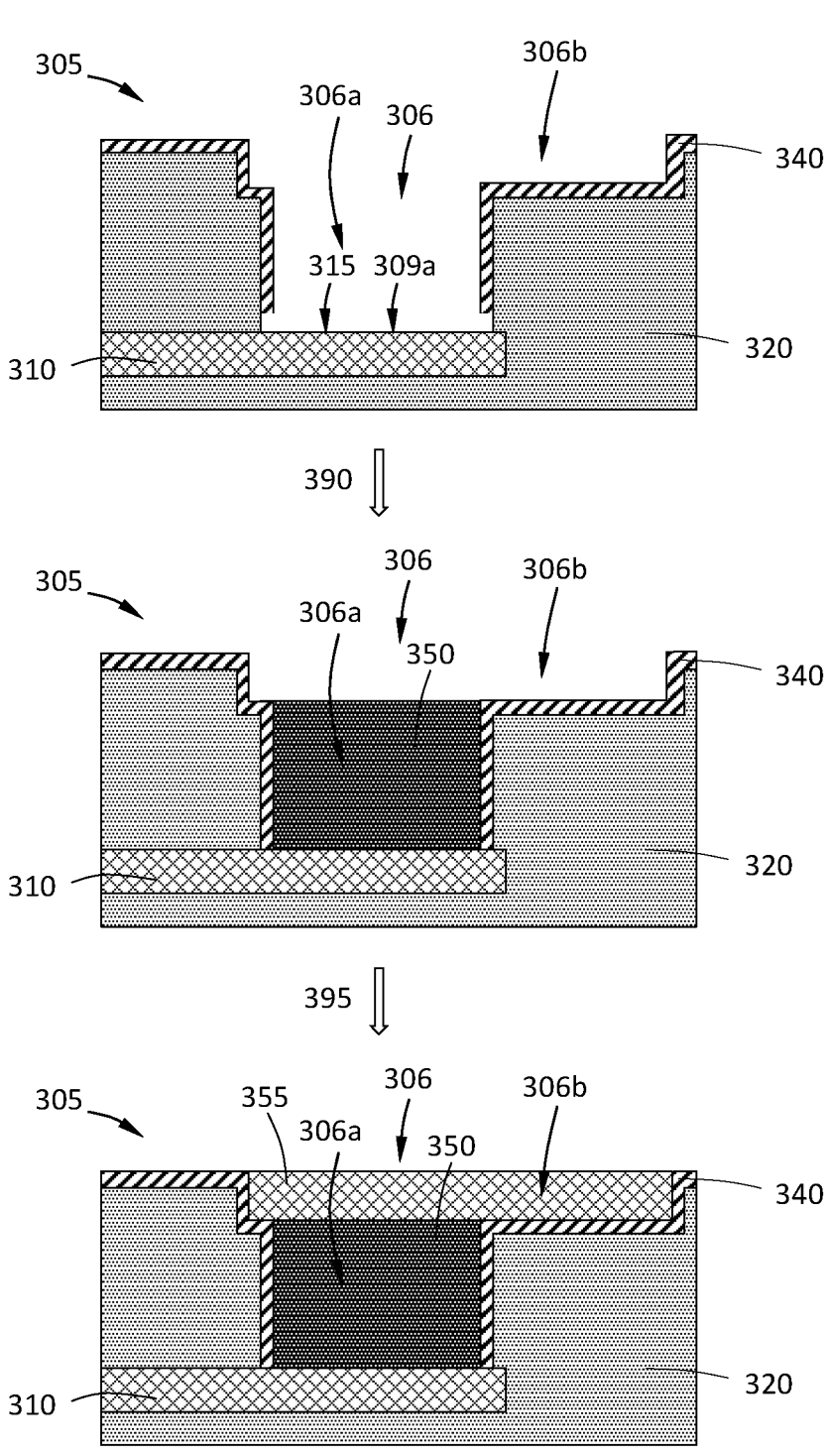

FIG. 3 illustrates another embodiment of the disclosure similar to those shown in FIGS. 1 and 2. The method 300 shown in FIG. 3 occurs with the same materials and overall process as previously described. The embodiment illustrated in FIG. 3 is representative of a method 300 for the formation of a via connecting $M_x$ and $M_{x+1}$ metal lines, as will be recognized by the skilled artisan. For simplicity, the treatment of the first surface (similar to operations 150 and 250) to form the modified first surface 315 is not shown. FIG. 3 illustrates a substrate 305 having a first material 310 comprising a conductive material and a second material 320 comprising an insulating material. A feature 306 is formed in the substrate 305 with multiple tiers or levels. The feature 306 has lower portion 306a and an upper portion 306b. The lower section has sidewalls 307a, 308a and bottom 309a. The upper section has sidewalls 307b, 308b and bottom 309b. The sidewalls 307a, 307b, 308a, 308b are formed by the second material 320. The bottom 309a of the lower portion 306a is formed by the modified first surface 315 of the first material 310. The first material 310 is also referred to as the $M_x$ line. The bottom 309b is formed by the upper section surface 323 of the second material 320.

While not shown in FIG. 3, method 300 beings with a pretreatment operation similar to previously disclosed methods 100, 200. As identified above, the first material 310 has a modified first surface 315.

At process 360, the substrate is exposed to a blocking compound to selectively form a blocking layer 330 on the surface 315 of the first material 310 forming the bottom 309a of the lower portion 306a of the feature 306 over the surface of the second material 320 forming the substrate top surface 302, the sidewalls 307a, 307b, 308a, 308b and bottom 309b of the upper section surface 323.

The method 300 continues at operation 370 by selectively depositing a barrier layer 340 on the second material 320 over the blocking layer 330. As illustrated in FIG. 3, the barrier layer 340 is deposited selectively on the sidewalls 307a, 307b, 308a, 308b, bottom 309b of the upper section surface 323 of the second material 320 and the substrate top surface 302. The barrier layer 340 is deposited on the exposed second material 320 surfaces and not on the exposed surface if the first material 310. The barrier layer 340 can be deposited by any suitable technique known to the skilled artisan. In some embodiments, the barrier layer 340 is deposited by sequentially exposing the substrate 305 to a metal precursor and a reactant.

The method 300, at operation 380, includes removing the blocking layer 330 from the modified first surface 315 of the first material 310 on the bottom 309a of the lower portion 306a of the feature 306.

The method 300 continues at operation 390 with a selective via deposition. A second film 350 comprising a conductive fill material is deposited within at least the lower portion 306a of the feature 306 to form a low-resistance metal via. In the illustrated embodiment, the second film 350 is formed only in the lower portion 306a of the feature 306. However, the skilled artisan will recognize that the conductive fill material can be deposited to fill the entire feature 306 including the upper portion 306b.

In embodiments like that illustrated in FIG. 3, in which the second film 350 is grown in a bottom-up manner to fill the via portion that makes up the lower portion 306a of the feature 306, a third film 355 is deposited in the upper portion 306b. For example, in operation 395, as illustrated in FIG. 3, the upper portion 306b of the feature 306 is filled with a third film 355 comprising a conductive material to form the $M_{x+1}$ conductive line.

The third film 355 can be any suitable material known to the skilled artisan. In the illustrated embodiment, the first material 310 and the third film 355 are the same material, and the second film 350 is a different material. For example, in some embodiments, the first material 310 and third film 355 comprise copper and the second film 350 comprises cobalt. In some embodiments, the second film 350 and the third film 355 are the same material. In some embodiments, the entire feature 306 is filled with a single material at one time to fill the lower portion 306a and upper portion 306b of the feature 306 in one process.

The third film 355 can be deposited by any suitable technique known to the skilled artisan. In some embodiments, the third film 355 is deposited by one or more of a chemical vapor deposition (CVD) process, an atomic layer deposition (ALD) process or a physical vapor deposition (PVD) process. In some embodiments, the third film 355 is deposited to overfill the feature 306 and form an overburden on the top surface 302 of the substrate 305. The overburden is then removed by any suitable technique (e.g., etching, chemical-mechanical planarization (CMP)).

Figure 4:
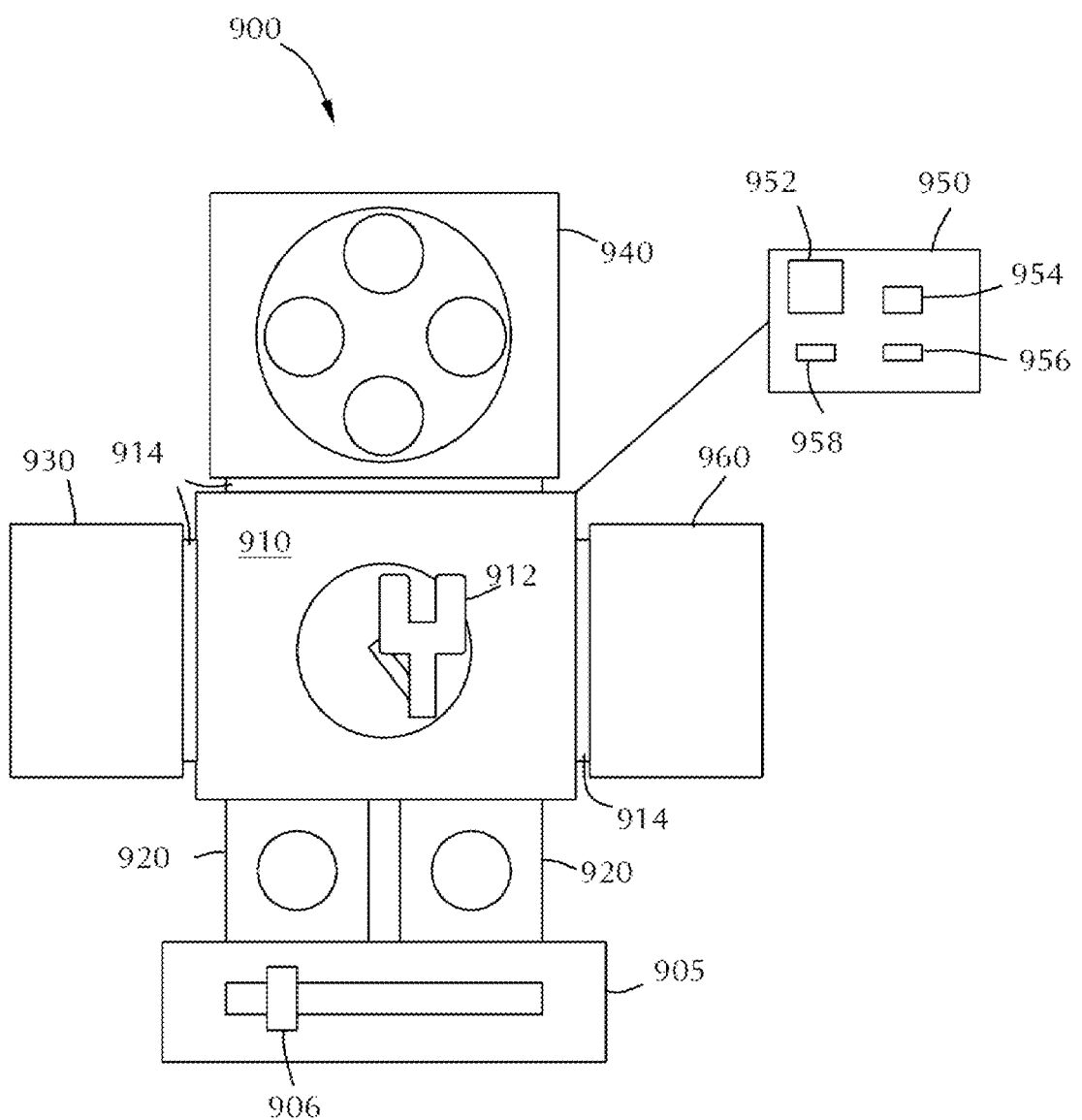
FIG. 4. illustrates an exemplary cluster tool according to one or more embodiment of the disclosure.

With reference to FIG. 4, additional embodiments of the disclosure are directed to a processing system 900 for executing the methods described herein. FIG. 4 illustrates a system 900 that can be used to process a substrate according to one or more embodiment of the disclosure. The system 900 can be referred to as a cluster tool. The system 900 includes a central transfer station 910 with a robot 912 therein. The robot 912 is illustrated as a single blade robot; however, those skilled in the art will recognize that other robot 912 configurations are within the scope of the disclosure. The robot 912 is configured to move one or more substrate between chambers 920, 930, 940, 960 connected to the central transfer station 910.

At least one pre-clean/buffer chamber 920 may be connected to the central transfer station 910. The pre-clean/buffer chamber 920 can include one or more of a heater, a radical source or plasma source. The pre-clean/buffer chamber 920 can be used as a holding area for an individual semiconductor substrate or for a cassette of wafers for processing. The pre-clean/buffer chamber 920 can perform pre-cleaning processes or can pre-heat the substrate for processing or can simply be a staging area for the process sequence. In some embodiments, there are two pre-clean/buffer chambers 920 connected to the central transfer station 910.

In the embodiment shown in FIG. 4, the pre-clean chambers 920 can act as pass through chambers between the factory interface 905 and the central transfer station 910. The factory interface 905 can include one or more robot 906 to move substrate from a cassette to the pre-clean/buffer chamber 920. The robot 912 can then move the substrate from the pre-clean/buffer chamber 920 to other chambers within the system 900.

A first processing chamber 930 can be connected to the central transfer station 910. The first processing chamber 930 can be configured as a surface pretreatment chamber and/or a blocking layer deposition chamber for modifying the first surface and forming the blocking layer. The first processing chamber 930 may be in fluid communication with one or more reactive gas sources to provide one or more flows of reactive gases to the first processing chamber 930. The substrate can be moved to and from the processing chamber 930 by the robot 912 passing through an isolation valve 914.

Processing chamber 940 can also be connected to the central transfer station 910. In some embodiments, processing chamber 940 comprises a film deposition chamber and is fluid communication with one or more reactive gas sources to provide flows of reactive gas to the processing chamber 940 to perform the deposition process. The substrate can be moved to and from the processing chamber 940 by robot 912 passing through an isolation valve 914.

In some embodiments, processing chamber 960 is connected to the central transfer station 910 and is configured to act as a blocking layer removal chamber. The processing chamber 960 can be configured to perform one or more deposition processes.

In some embodiments, each of the processing chambers 930, 940, and 960 are configured to perform different portions of the processing method. For example, processing chamber 930 may be configured to perform the pretreatment and/or blocking layer formation process, processing chamber 940 may be configured to perform one or more of the film deposition processes, and processing chamber 960 may be configured to perform the blocking layer removal process. The skilled artisan will recognize that the number and arrangement of individual processing chamber on the tool can be varied and that the embodiment illustrated in FIG. 4 is merely representative of one possible configuration.

In some embodiments, the processing system 900 includes one or more metrology stations. For example, metrology stations can be located within pre-clean/buffer chamber 920, within the central transfer station 910 or within any of the individual processing chambers. The metrology station can be any position within the system 900 that allows properties of the substrate to be measured without exposing the substrate to an ambient environment.

At least one controller 950 is coupled to one or more of the central transfer station 910, the pre-clean/buffer chamber 920, or processing chambers 930, 940, or 960. In some embodiments, there is more than one controller 950 connected to the individual chambers or stations and a primary control processor is coupled to each of the separate controllers to control the system 900. The controller 950 may be one of any form of general-purpose computer processor, microcontroller, microprocessor, etc., that can be used in an industrial setting for controlling various chambers and sub-processors.

The at least one controller 950 can have a processor 952, a memory 954 coupled to the processor 952, input/output devices 956 coupled to the processor 952, and support circuits 958 to communication between the different electronic components. The memory 954 can include one or more of transitory memory (e.g., random access memory) and non-transitory memory (e.g., storage).

The memory 954, or computer-readable medium, of the processor may be one or more of readily available memory such as random-access memory (RAM), read-only memory (ROM), floppy disk, hard disk, or any other form of digital storage, local or remote. The memory 954 can retain an instruction set that is operable by the processor 952 to control parameters and components of the system 900. The support circuits 958 are coupled to the processor 952 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

In some embodiments, the controller 950 has one or more configurations to execute individual processes or sub-processes to perform the method. The controller 950 can be connected to and configured to operate intermediate components to perform the functions of the methods. For example, the controller 950 can be connected to and configured to control one or more of gas valves, actuators, motors, slit valves, vacuum control, etc.

The controller 950 of some embodiments has one or more configurations selected from: a configuration to move a substrate on the robot between the plurality of processing chambers or a metrology station; a configuration to load and/or unload substrates from the system; a configuration to pretreat the first surface of the substrate; a configuration to form a blocking layer on the modified first surface; a configuration to selectively deposit a first film on the second surface; a configuration to remove the blocking layer; and/or a configuration to deposit a second film on the first material and/or the first film.

Examples

Several cobalt substrates were processed as indicated in Table 1 below. After the processes of Table 1, each substrate was processed with 36 cycles of an ALD deposition process and 30 seconds of a post-deposition plasma treatment.

TABLE 1

| Substrate | Pretreatment | Blocking Layer | Removal | Observed Thickness of ALD Film (Å) |
|-----------|--------------|----------------|---------|------------------------------------|
| 1 | | | X | 15.91 |
| 2 | | X | X | 13.12 |
| 3 | X | X | | 1.99 |
| 4 | X | X | X | 14.55 |

The inventors found that when a blocking layer was deposited, using a pretreatment before removal provided more deposition. This result indicated a more efficient removal of the blocking layer.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A reverse selective deposition method comprising:
exposing a substrate to a surface pretreatment comprising ammonia, the substrate including at least one feature extending from a top surface of the substrate to a bottom, the at least one feature having a width between a first sidewall and a second sidewall, the bottom comprising a first material with a first surface and the first sidewall and second sidewall comprising a second material with a second surface, wherein the pretreatment chemisorbs nitrogen atoms to at least a portion of the first surface and forms a modified first surface;
exposing the substrate to a blocking compound comprising 5-decyne to selectively form a blocking layer on the modified first surface, wherein the nitrogen atoms are interposed between at least some molecules of the blocking layer and the first surface;

selectively depositing a barrier layer on the second surface over the blocking layer, the barrier layer selected from the group consisting of tantalum nitride and titanium nitride; and
removing the blocking layer from the first material, wherein the surface pretreatment does not contain plasma and facilitates the removal of the blocking layer from the first surface.

2. The method of claim 1, wherein the first material comprises a conductive material and the second material comprises an insulating material.

3. The method of claim 2, wherein the first material comprises one or more of copper, cobalt, tungsten, molybdenum or ruthenium.

4. The method of claim 2, wherein the second material comprises one or more of silicon oxide, silicon nitride or a low-k dielectric.

5. The method of claim 1, wherein the barrier layer is deposited by sequentially exposing the substrate surface to a metal precursor and a reactant.

6. The method of claim 5, wherein the metal precursor comprises pentakis(dimethylamino)tantalum, the reactant comprises ammonia and the barrier layer comprises tantalum nitride.

7. The method of claim 1, further comprising exposing the barrier layer and the blocking layer to a post-treatment before removing the blocking layer.

8. The method of claim 1, wherein removing the blocking layer comprises exposing the substrate surface to a plasma formed from a plasma gas.

9. The method of claim 8, wherein the plasma gas comprises hydrogen ($H_2$) and argon.

10. The method of claim 1, further comprising depositing a second film on the barrier layer and the first material after removing the blocking layer.

11. The method of claim 1, wherein the substrate is maintained at a temperature in a range of about 100° C. to about 300° C.

* * * * *